United States Patent
Chen et al.

(10) Patent No.: US 9,773,789 B1
(45) Date of Patent: Sep. 26, 2017

(54) DYNAMIC RANDOM ACCESS MEMORY DEVICE

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Yi-Wei Chen, Taichung (TW); Tsun-Min Cheng, Changhua County (TW); Chih-Chieh Tsai, Kaohsiung (TW); Kai-Jiun Chang, Taoyuan (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/260,292

(22) Filed: Sep. 8, 2016

(51) Int. Cl.
*H01L 29/49* (2006.01)
*H01L 27/108* (2006.01)

(52) U.S. Cl.
CPC .. *H01L 27/10823* (2013.01); *H01L 27/10897* (2013.01)

(58) Field of Classification Search
CPC .............. H01L 27/10823; H01L 27/10897
See application file for complete search history.

(56) References Cited

U.S. PATENT DOCUMENTS

| | | | |
|---|---|---|---|
| 6,436,762 B1* | 8/2002 | Tzeng | H01L 27/10888 257/E21.019 |
| 6,753,568 B1* | 6/2004 | Nakazato | B82Y 10/00 257/314 |
| 6,797,564 B1* | 9/2004 | Wu | H01L 21/76897 257/E21.507 |
| 7,915,121 B1 | 3/2011 | Kim | |
| 8,785,998 B2 | 7/2014 | Chung et al. | |
| 8,871,559 B2 | 10/2014 | Horii et al. | |

* cited by examiner

Primary Examiner — Michael Shingleton
(74) Attorney, Agent, or Firm — Winston Hsu

(57) ABSTRACT

A dynamic random access memory (DRAM) device includes a substrate, plural buried gates and plural bit lines. The buried gates are disposed in the substrate along a first trench extending along a first direction. The bit lines are disposed over the buried gates and extending along a second direction across the first direction. Each of the bit lines includes a multi-composition barrier layer, wherein the multi-composition barrier layer includes $WSi_xN_y$ with x and y being greater than 0 and the multi-composition barrier layer is silicon-rich at a bottom portion thereof and is nitrogen-rich at a top portion thereof.

11 Claims, 4 Drawing Sheets

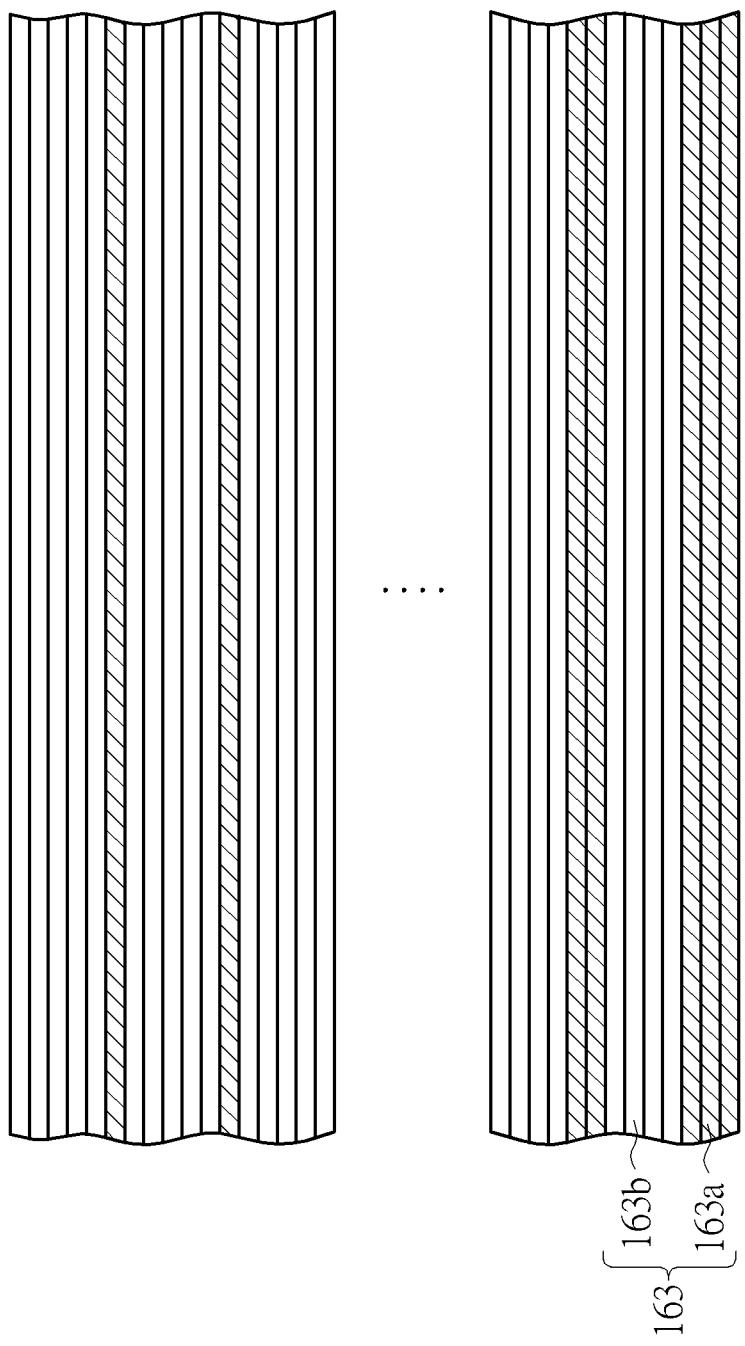

DYNAMIC RANDOM ACCESS MEMORY DEVICE

BACKGROUND OF THE INVENTION

1. Field of the Invention

The present invention generally relates to the field of memory devices, and more particularly to a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

One object of the present invention is to provide a DRAM device, and the bit lines disposed therein have a multi-composition barrier layer. The multi-composition barrier layer is nitrogen-rich at the top portion and is silicon-rich at the bottom portion, so that, the resistances between the multi-composition barrier layer and the stacked layers below and/or above the multi-composition barrier layer are sufficiently reduced.

To achieve the purpose described above, the present invention provides a DRAM device including a substrate, a plurality of buried gates and a plurality of bit lines. The buried gates are disposed in a substrate along a first trench extending along a first direction. The bit lines are disposed over the buried gates and extend along a second direction across the first direction. Each of the bit lines includes a multi-composition barrier layer, the multi-composition barrier layer includes $WSi_xN_y$ with x and y being greater than 0, and the multi-composition barrier layer is silicon-rich at a bottom portion thereof and is nitrogen-rich at a top portion thereof.

The DRAM device in the present invention is characterized by disposing a multi-composition barrier layer between the polysilicon layer and the metal conductive layer in each bit line, and the multi-composition barrier layer includes $WSi_xN_y$ with x and y being greater than 0. The bottom portion of the multi-composition barrier layer is silicon-rich, that is, the bottom portion may serve as an ohmic contact layer thereto reduce the resistance between the barrier layer and the polysilicon layer underneath. Otherwise, the top portion of the multi-composition barrier layer is nitrogen-rich, that is, the top portion may obtain bigger crystal grain thereto reduce the grain boundary between the barrier layer and the metal conductive layer. In this way, the resistance of the barrier layer itself may be sufficiently reduced accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a schematic diagram illustrating an enlarged view of the portion R in FIG. 3.

DETAILED DESCRIPTION

To provide a better understanding of the present invention, preferred embodiments will be described in detail. The preferred embodiments of the present invention are illustrated in the accompanying drawings with numbered elements.

Figure 1:
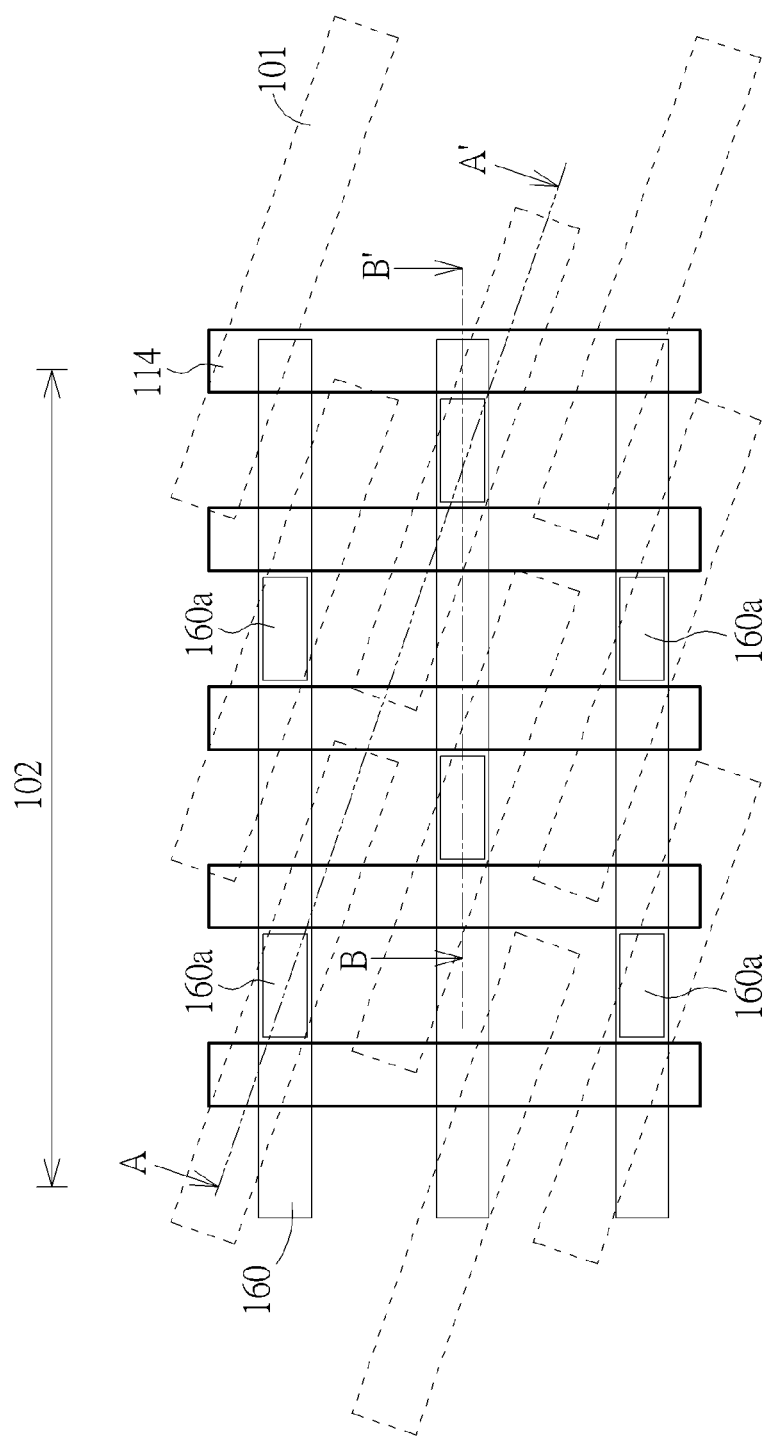
FIG. 1 is a schematic diagram illustrating a top view of a DRAM device according to a preferred embodiment of the present invention.
Figure 2:
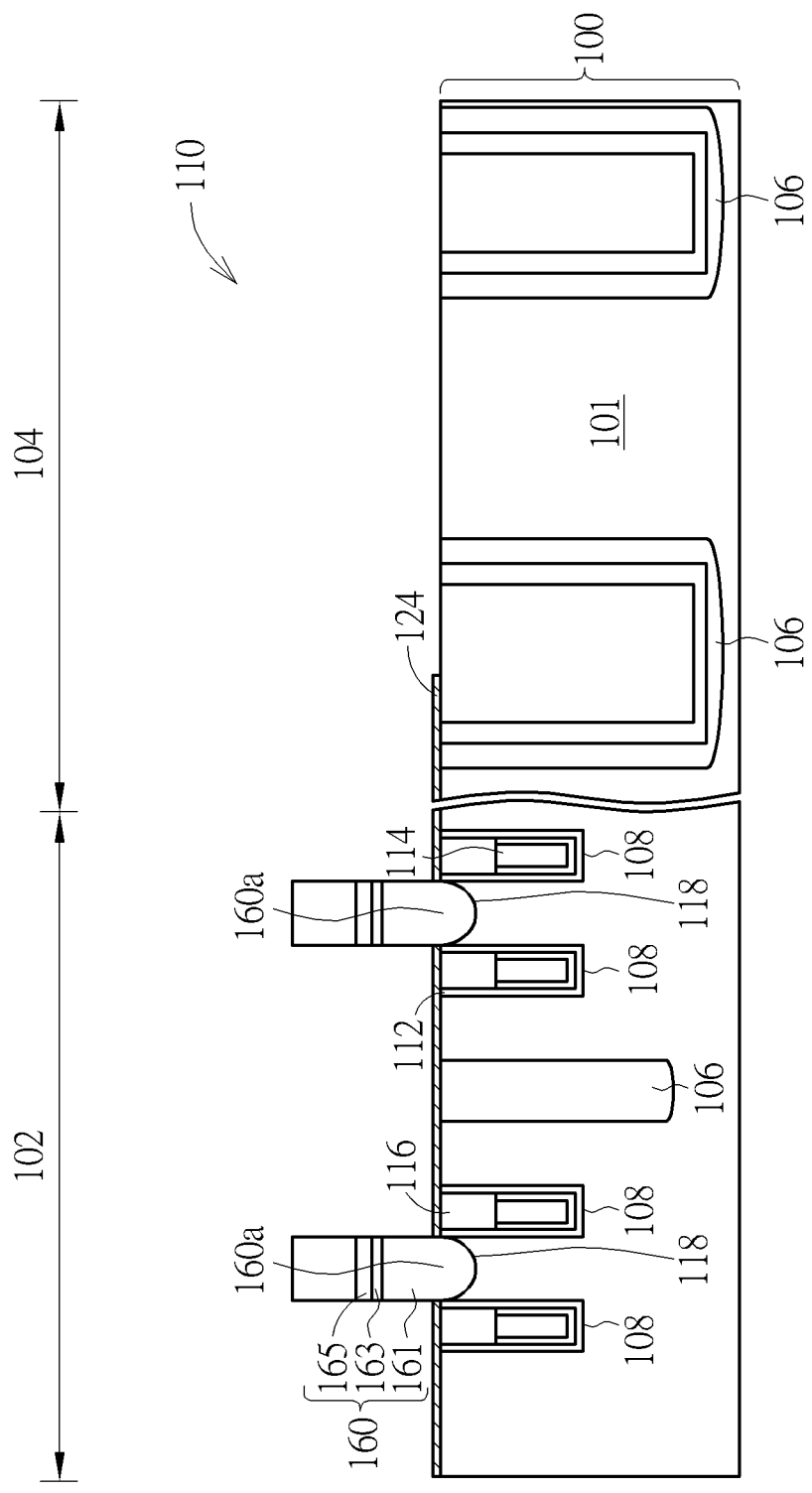
FIG. 2 is a schematic diagram illustrating a cross-sectional view taken along a line A-A' in FIG. 1.
Figure 3:
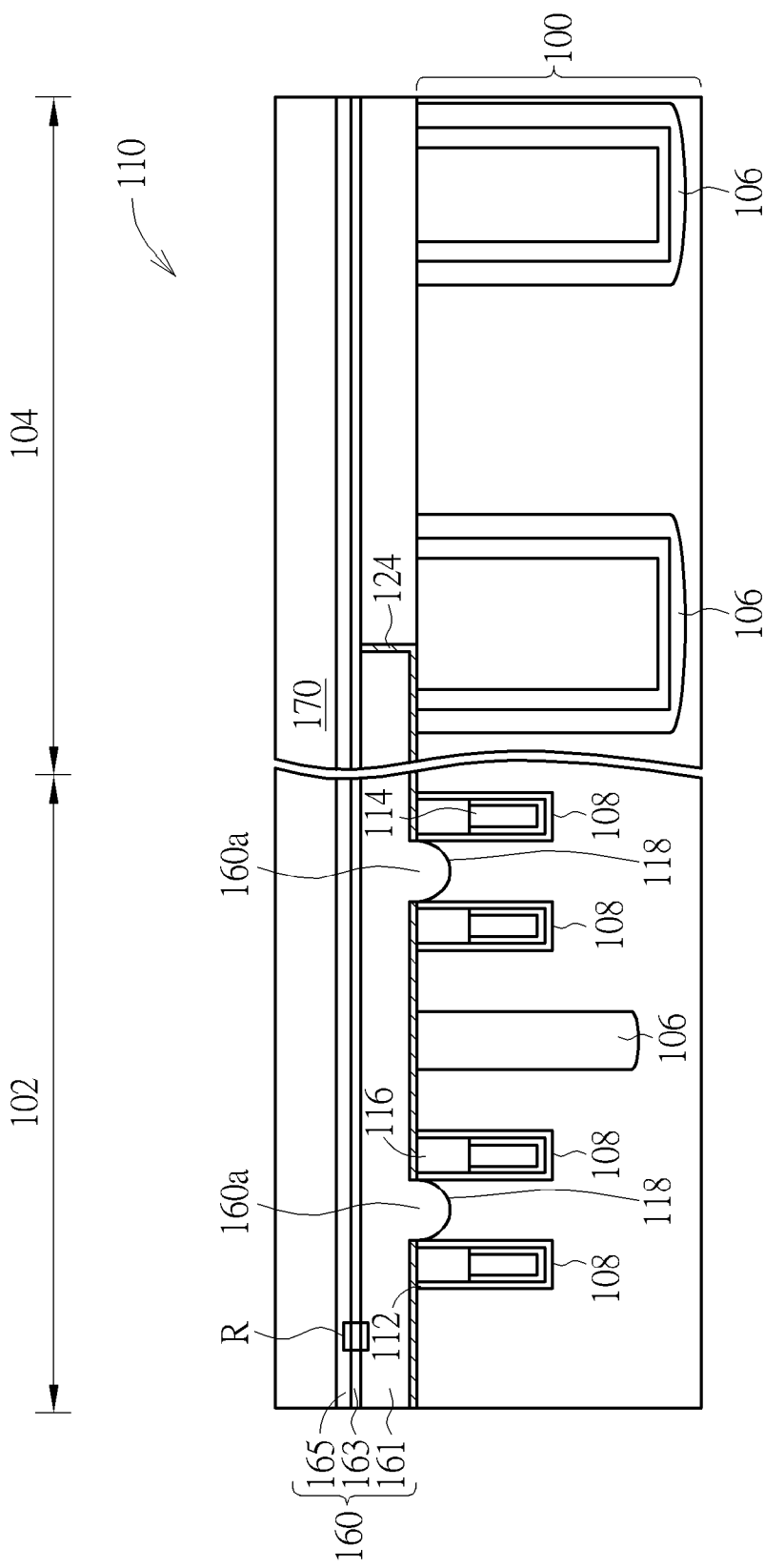
FIG. 3 is a schematic diagram illustrating a cross-sectional view taken along a line B-B' in FIG. 1.

Referring to FIGS. 1-3, FIGS. 1-3 illustrate a dynamic random access memory (DRAM) device according to a preferred embodiment of the present invention, in which FIG. 1 is a schematic top view of the DRAM device and FIGS. 2 and 3 are cross-sectional views taken along the line A-A' and the line B-B' respectively. In the present embodiment, a memory cell such as a DRAM device 110 with a buried gate is provided, the DRAM device 110 includes at least one transistor structure (not shown in the drawings) and at least one capacitor structure (not shown in the drawings), thereto serve as the smallest unit in the DRAM array for accepting signals from bit lines 160 and word lines during the operation.

The DRAM device 110 includes a substrate 100, and at least one shallow trench isolation (STI) 106 is formed in the substrate 100 to define a plurality of active areas (AA) 101 as shown in FIG. 1 on the substrate 100. Also, a memory region 102 and a periphery region 104 are further defined on the substrate 100, wherein a plurality of word lines (WL, namely the gates 114) and a plurality of bit lines (BL) 160 in the DRAM device 110 are both formed in the memory region 102 as shown in FIG. 2, and other active elements (not shown in the drawings) may further be formed in the periphery region 104. It is noted that, FIG. 1 only illustrates the top view of the memory region 102 in the DRAM device 110 and the elements formed in the periphery region 104 in the DRAM device 110 have been omitted in FIG. 1.

In the present embodiment, each of the active areas 101 are formed in parallel with one another along a first direction, and the gates 114 are formed in the substrate 100, across on each active area 101. Precisely speaking, each of the gates 114 are formed along a trench 108 formed in the substrate 100, and the trench 108 is formed along a second direction which is across the first direction for example. In one embodiment, the formation of the gate 114 may include firstly forming a dielectric layer 112 such as a silicon oxide layer covered on surfaces of the trench 108 to serve as a gate dielectric layer, forming the gate 114, and then forming an insulating layer 116 on the gate 114. Through the aforementioned forming steps, the insulating layer 116 is leveled with the top surface of the substrate 100, and the gate 114 may be performed like a buried word line (BWL) as shown in FIGS. 2 and 3.

On the other hand, the bit lines are formed in parallel with one another on the substrate 100 along a third direction and also across each active area 101, and the third direction is different from the first direction and the second direction. In one preferred embodiment, the third direction is preferably perpendicular to the second direction. That is, the first direction, the second direction and the third direction are all different from each other and the first direction is not perpendicular to either the second direction or the third direction, as shown in FIG. 1. The bit lines 106 and the word lines 114 are isolated from each other through an insulating layer 124 disposed on the substrate 100, and the bit lines 160 are electrically connected to a source/drain region (not shown in the drawings) of the transistor structure via at least one bit line contact (BLC) 160a. The bit line contact 160a may be formed below the bit lines 160 between two word lines 114. Moreover, the bit line contact 160a includes a conductive layer such as a semiconductor layer like a polysilicon layer 161 shown in FIG. 2.

In one embodiment, the formation of the bit line contacts 160a include firstly forming a plurality of trenches 118 in the substrate 100, and forming the polysilicon layer 161 to fill up the trenches 118 and to further cover on the insulating layer 124, as shown in FIGS. 2 and 3. Following these, a barrier layer 163, a metal conductive layer 165 and a mask layer 170 are formed on the polysilicon layer 161, and the mask layer 170 and the metal conductive layer 165, the barrier layer 163 and the polysilicon layer 161 underneath are than patterned to form the bit lines 160 and the bit line contacts 161a under the bit line 160 simultaneously. In other words, the bit lines 160 and the bit line contacts 160a are monolithic and are formed through the same polysilicon layer 161.

It is noted that, each of the bit lines 160 consists of the polysilicon layer 161, the barrier layer 163 and the metal conductive layer 163 stacked sequent on the substrate 100, in which the barrier layer 163 includes a multi-composition structure with $WSi_xN_y$, and the metal conductive layer 163 includes low-resistant metals such as tungsten (W), aluminum (Al) or copper (Cu), but is not limited thereto. The barrier layer 163 is disposed to reduce the contact resistance, as well as the sheet resistance, of the polysilicon layer 161 and the metal conductive layer 163, and which may include a plurality of first metal oxide layers and a plurality of second metal oxide layers stacked alternately one over another with at least plural first metal oxide layers directly in contact with each other or with at least plural second metal oxide layers directly in contact with each other. The first metal oxide layers and the second metal oxide layers are formed through an atomic layer deposition (ALD) process by sequentially importing different precursors during the ALD process. For example, precursors of tungsten hexafluoride ($WF_6$) and silane ($SiH_4$) may be imported to form the first metal oxide layer such as a tungsten silicon (WSi) layer 163a, and precursors of $WF_6$ and ammonia ($NH_3$) may be imported to form the second metal oxide layer such as a tungsten nitride (WN) layer 163b. That is, the WSi layer 163a has a relative smaller resistance so as to reduce the resistance between the barrier layer 163 and the polysilicon layer 161 underneath, and the WN layer 163b has a relative greater crystal grain so as to reduce the grain boundary between the barrier layer 163 and the metal conductive layer 165 above.

Please also note that, although the barrier layer 163 of the present embodiment is mainly formed by performing the WN layer 163b cycles that imports the precursors of $WF_6$ and $NH_3$, some WSi layer 163a cycles are also performed between the WN layer 163b cycles. Also, in the early stage of the deposition, a ratio between the quantities of the stacked WN layers 163b and the stacked WSi layers 163a is about 2:1 to 4:3, as shown in FIG. 4. However, in another embodiment, the ratio between the quantities of the stacked WN layers 163b and the stacked WSi layers 163a in the early stage of the deposition may also reach to 0.1-1:10-20, but is not limited thereto. Then, the WN layer 163b cycles are gradually increased during the deposition process of the barrier layer 163. Thus, in the late stage of the deposition, a ratio between the quantities of the stacked WN layers 163b and the stacked WSi layers 163a is about 5:1 to 10:1, as shown in FIG. 4. Otherwise, in another embodiment, the ratio between the quantities of the stacked WN layers 163b and the stacked WSi layers 163a in the late stage of the deposition may reach to 10-20:0.1-1, but is not limited thereto. In other words, the barrier layer 163 of the present embodiment includes the multi-composition structure of $WSi_xN_y$, where in the early stage of the formation process thereof, a bottom portion (namely the portion closed to the polysilicon layer 161) of the barrier layer 163 is formed to be silicon-rich, and a ratio of x:y in the bottom portion is about 10-20:0.1. In contrast, in the late stage of the formation process thereof, a top portion (namely the portion closed to the metal conductive layer 165) of the barrier layer 163 is formed to be nitrogen-rich, and a ratio of x:y in the top portion is about 0.1:10-20, but is not limited thereto.

In another embodiment, a single barrier layer with continuously and gradually increased or decreased silicon or nitrogen may also be formed. The barrier layer also includes $WSi_xN_y$, with x and y being greater than 0, and the ratio of x:y is varied by each portion of the barrier layer. Preferably, the ratio of x:y is varied from 20:0.1 to 0.1:20 from the bottom to the top, but is not limited thereto. Precisely speaking, the barrier layer may include a single film, wherein the bottom portion of the single film, the ratio of x:y is about 10-20:0.1-1, and the ratio of x may decrease while moving to the upper portion and the ratio of y may increase while moving to the upper portion. That is, in the top portion of the single film, the ratio of x:y is about 0.1-1:10-20.

Thus, people in the art should easily realize that although the formation of the barrier layer 163 shown in FIG. 4 is exemplified by first performing three times of the WSi layer 163a cycles followed by performing four times of the WN layer 163b cycles, two times of the WSi layer 163a cycles and four times of the WN layer 163b cycles, the forming process of the barrier layer 163 in the present invention is not limited to be formed through first performing the WSi layer 163a cycle or the WN layer 163b cycle. In other embodiments, the barrier layer may also be formed through first performing the WN layer 163b cycle followed by performing the WSi layer 163a cycle, wherein the quantities of the WN layers 163b and the WSi layers 163a in the bottom portion of the barrier layer may still be about 4:3 to 2:1, and the quantities of the WN layers 163b and the WSi layers 163a in the top portion of the barrier layer may still be about 10-20:0.1-1.

Overall, the DRAM device in the preferred embodiment of the present invention further disposes a multi-composition barrier layer between the polysilicon layer and the metal conductive layer in the bit lines, and the multi-composition barrier layer includes $WSi_xN_y$, with x and y being greater than 0. The bottom portion (namely, the portion closed to the polysilicon layer underneath) of the multi-composition barrier layer is formed from a higher ratio of the stacked WSi layers, so as to be silicon-rich accordingly. The ratio of x:y is about 10-20:0.1-1 in the bottom portion, that is, the bottom portion may serve as an ohmic contact layer thereto reduce the resistance between the barrier layer and the polysilicon layer. Otherwise, the top portion (namely, the portion closed to the metal conductive layer) of the multi-composition barrier layer is formed from a higher ratio of the stacked WN layers, so as to be nitrogen-rich accordingly. The ratio of x:y is about 0.1-1:10-20 in the top portion, that is, the top portion may obtain bigger crystal grain thereto reduce the grain boundary between the barrier layer and the metal conductive layer. In this way, the resistance of the barrier layer itself may be sufficiently reduced. Furthermore, since the multi-composition barrier layer of the present invention consists of single material and is formed only through the ALD process, the additional stacked layers with different material have been omitted. That is, the height of the bit line is able to be reduced accordingly, and the fabrication of the barrier layer in the present invention may be easily achieved through a simplified and convenient process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM) device, comprising:
   a plurality of buried gates, disposed in a substrate along a first trench extending along a first direction; and
   a plurality of bit lines disposed over the buried gates and extending along a second direction across the first direction, each of the bit lines comprising a multi-composition barrier layer, wherein the multi-composition barrier layer comprises $WSi_xN_y$ with x and y being greater than 0, and the multi-composition barrier layer is silicon-rich at a bottom portion thereof and is nitrogen-rich at a top portion thereof.

2. The DRAM device according to claim 1, wherein in the bottom portion of the multi-composition barrier layer, a ratio of x:y is about 10-20:0.1-1.

3. The DRAM device according to claim 1, wherein in the top portion of the multi-composition barrier layer, a ratio of x:y is about 0.1:10-20.

4. The DRAM device according to claim 1, wherein x gradually decreases from 20 to 0.1 from the bottom to the top of the multi-composition barrier layer, and y gradually increases from 0.1 to 20 from the bottom to the top of the multi-composition barrier layer.

5. The DRAM device according to claim 1, wherein the multi-composition barrier layer comprises a plurality of WSi layers and a plurality of WN layers stacked alternately.

6. The DRAM device according to claim 5, wherein in the bottom portion of the multi-composition barrier layer, a ratio between quantities of the WN layers and the WSi layers is about 2:1 to 4:3.

7. The DRAM device according to claim 5, wherein in the top portion of the multi-composition barrier layer, a ratio between quantities of the WN layers and the WSi layers is about 5:1 to 10:1.

8. The DRAM device according to claim 1, wherein each of the bit lines further comprises a conductive layer disposed on the multi-composition barrier layer.

9. The DRAM device according to claim 1, wherein each of the bit lines further comprises a polysilicon layer disposed below the multi-composition barrier layer.

10. The DRAM device according to claim 9, further comprising:
    at least one contact disposed below the bit lines between two buried gates.

11. The DRAM device according to claim 10, wherein the contact and the polysilicon layer are monolithic.

* * * * *